United States Patent [19]

Wilson

[11] 3,736,513

[45] May 29, 1973

[54] RECEIVER TUNING SYSTEM

[75] Inventor: Donald A. Wilson, Chicago, Ill.

[73] Assignee: Warwick Electronics Inc., Chicago, Ill.

[22] Filed: June 28, 1971

[21] Appl. No.: 157,539

[52] U.S. Cl. ....................325/421, 325/468, 331/19, 334/16

[51] Int. Cl. ....................H04b 1/16

[58] Field of Search ....................325/418–423, 464, 468–471; 331/4, 19, 40, 179; 328/134; 334/11, 16, 13, 18, 26

[56] References Cited

UNITED STATES PATENTS 3,641,434 2/1972 Yates....................325/421 X 3,619,802 11/1971 Lohrmann....................331/19 X

*Primary Examiner*—Benedict V. Safourek

*Attorney*—Axel A. Hofgren, Ernest A. Wegner and William J. Stellman et al.

[57] ABSTRACT

A harmonic generator produces simulated station signals which are heterodyned in the mixer stage of a receiver. A local oscillator of the receiver is swept through its frequency bandwidth, producing an IF pulse each time the receiver tunes one of the simulated stations. The IF pulses are counted, and upon reaching a number preset on station selection switches, convert the sweep circuit to an AFC amplifier, maintaining the receiver tuned to a desired station frequency.

16 Claims, 3 Drawing Figures

Patented May 29, 1973 3,736,513

2 Sheets-Sheet 1

Inventor:—
Donald A. Wilson
By Hofgren, Wegner, Allen, Stellman & McCord Attys.

RECEIVER TUNING SYSTEM

This invention relates to an improved automatic tuning system for a receiver, and more particularly to a tuning system for selecting one of a large number of individual stations or channels.

Many tuning systems are known which allow pushbutton selection of a desired station or channel which is to be received on a radio wave receiver. One electrical tuning system which has been suggested makes use of a frequency synthesizer for automatic digital command. In such a suggested system, a comb of frequencies is generated by a harmonic oscillator and coupled to a phase detector also having an input from the local oscillator of the receiver. A ramp generator drives the local oscillator through a band of frequencies, producing detected pulses which are counted to a preset number.

The necessity for a separate phase detector makes such a tuning system unnecessarily complex. Furthermore, any drift between the receiver IF tuning and the synthesized signals may tune the receiver to a frequency offset from the actual desired station. If the frequencies to be received are widely spaced, additional mixers may be required.

In accordance with the present invention, an improved digital tuning system makes dual use of several stages in a conventional receiver, without alteration, eliminating the necessity for a separate phase detector and other circuits heretofore necessary. The resulting simplification makes the tuning system economical for use on AM broadcast frequency radio receivers and other applications where cost is a critical factor. In addition, the operation of the tuning system is improved since frequency ambiguity is eliminated due to dual use of the mixer in the receiver. An improved sweep stage is also disclosed which is converted by biasing to an AFC amplifier.

Other features and advantages of the invention will be apparent from the following description, and from the drawings, in which.

Figure 1:
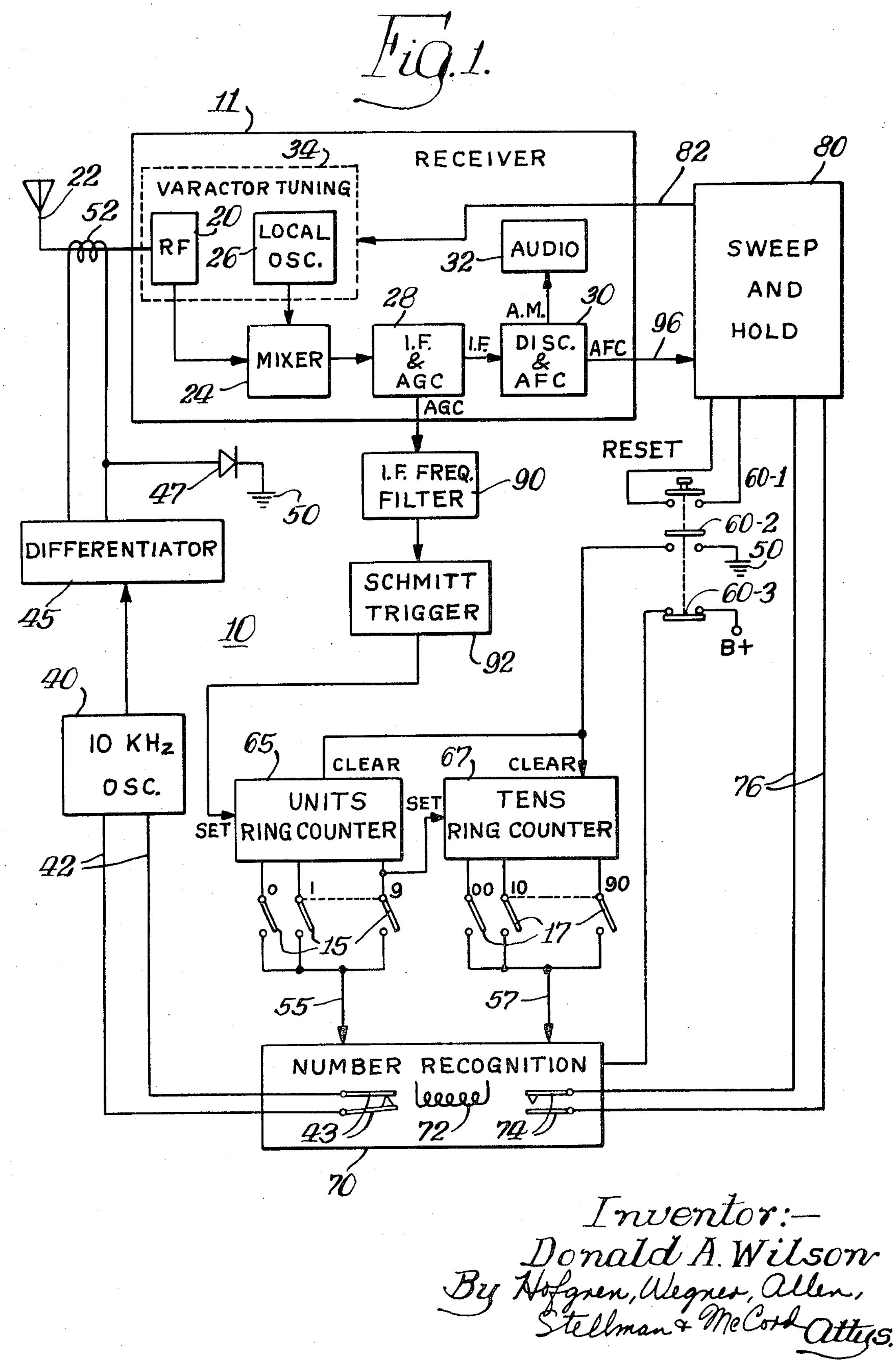
FIG. 1 is a block diagram of the novel automatic tuning system, connected to tune a conventional radio wave receiver.

While an illustrative embodiment of the invention is shown in the drawings and will be described in detail herein, the invention is susceptible of embodiment in many different forms and it should be understood that the present disclosure is to be considered as an exemplification of the principles of the invention and is not intended to limit the invention to the embodiment illustrated. Throughout the specification, values and type designations will be given for certain of the components in order to disclose a complete, operative embodiment of the invention. However, it should be understood that such values and type designations are merely representative and are not critical unless specifically so stated.

In FIG. 1, a novel automatic frequency selector 10 tunes a conventional radio wave receiver 11 to any station or channel frequency selected by actuation of one units switch 15 and one tens switch 17. As illustrated, any one of 99 stations within the AM broadcast band can be selected. Since each selectable station frequency is spaced apart by 10 kilohertz, as will appear, actuation for example of units switch "1" and tens switch "10" selects station number 11 which is located 110 kilohertz from the bottom of the AM broadcast band.

Receiver 11 includes an RF stage 20 for amplifying an incoming RF signal received on an antenna 22. The amplified RF is coupled to a detector, including a mixer stage 24, which also has an input from a local oscillator 26. Mixer 24 heterodynes the RF signal and local oscillations to produce an IF signal coupled to an IF and AGC stage 28. The amplified IF signal is coupled to a Discriminator (DISC.) and AFC stage 30 for detection before being coupled to an Audio Output stage 32. Different stations are tuned by a conventional varactor tuning system 34 which varies the frequency of oscillations from local oscillator 26. The varactor tuning system may also tune the RF stage 20 to provide increased selectivity. The above described stages within receiver 11 are conventional, and may take many different forms. While an AM radio receiver is described, the invention is equally adaptable for use with FM receivers, television receivers, or any tunable frequency receiver.

Automatic frequency selector 10 includes a stable 10 kHz oscillator 40, which may be crystal controlled. The oscillator 40 is energized or enabled whenever a pair of leads 42 complete a circuit through a normally closed switch contact 43. The leads 42 may comprise any pair of leads within an oscillator which must be shorted to maintain oscillation, such as a power supply or B+ connection, or a ground return path.

The output of oscillator 40 is coupled to a differentiator 45 chosen not to load the oscillator in order to obtain sufficient harmonic output to pass 10 kHz pulses spaced throughout the entire bandpass of receiver 11. In the present example, 10 kHz harmonic pulses extend at least to the 160th harmonic, i.e., 1600 kHz. Since differentiator 45 will produce a pair of opposite voltage spikes, either polarity voltage spike is shunted through a clipping diode 47 to a source of reference potential or ground 50. The unclipped harmonic pulses are coupled to RF stage 20 by a winding 52 wrapped around the input lead for antenna 22. Other networks can be substituted for the winding 52, to directly connect differentiator 45 to the RF stage 20, or directly to the input of mixer 24. The clipped, differentiated harmonic signals form simulated station signals located at the same frequencies allocated for the stations which are to be tuned.

To automatically tune receiver 11, an operator manually actuates the individual units switch 15 and tens switch 17 corresponding to the station to be received. The first station in the bandpass is designated station 01, and is selected by actuating the units switch labeled "1" and the tens switch labeled "00", selection station "01" which herein corresponds to 540 kHz. All units switches 15 are tied to a common line 55, and all tens switches 17 are tied to a common line 57. The switches may be associated with an appropriate dial, markings, or scale indicating to an operator the particular combination of switches which should be actuated to select any desired station frequency.

After selecting a station on switches 15 and 17, a start or reset switch 60 is manually actuated to begin the automatic tuning operation. Switch 60 includes a normally open contact section 60-1, a second normally open contact section 60-2, and a normally closed contact section 60-3, all ganged to a common pushbutton. Switch contact section 60-2 clears or resets all unit stages forming a units ring counter 65, and all 10 stages forming a tens ring counter 67. This may be accomplished by connecting ground 50 to a Clear input for each ring counter, or by any other conventional circuit. The switch contact section 60-3 opens power (B+) to a Number Recognition circuit 70, thereby deenergizing a relay coil 72 located therein. Relay coil 72 controls switch contacts 43, which upon deenergization return to a normally closed state. The closed circuit in turn enables oscillator 40, thereby generating the simulated station signals.

Relay coil 72 also controls a pair of switch contacts 74, which upon relay deenergization return to a normally open state. The relay contacts 74 are connected through a pair of leads 76 with a Sweep and Hold circuit 80 which controls sweeping of the bandpass, and holding or tracking a desired station upon energization of relay coil 72.

The closing of switch contact section 60-1 and the concurrent opening of switch contact 74 cause the Sweep and Hold circuit 80 generate a ramp-shaped voltage which is coupled over a line 82 to the varactor tuning circuits 34. The beginning point of the ramp voltage occurs one station location below the bandpass of the receiver, namely 530 kHz.

As the ramp voltage on line 82 increases, the varactor tuning circuits 34 cause the receiver 11 to sweep across its bandpass, from the lowest frequency to the highest frequency which can be received. As the ramp voltage initially increases to correspond with the first station location at 540 kHz, the harmonic pulse at 540 kHz is heterodyned in mixer stage 24, producing an intermediate frequency or IF pulse. This pulse is amplified in IF and AGC stage 28, producing a change in level on the IF output line and the AGC output line.

The change in voltage level occurring on the AGC output line, in advance of the AGC filters, is coupled to a filter 90 tuned to the IF frequency, such as 455 kHz for an AM radio receiver. The AGC pulse is passed through filter 90 to a level detector or trigger, as a Schmitt trigger 92 which produces an output pulse whenever a minimum triggering level is exceeded. The output pulse is coupled to the set input of the Ring Counter 65. This causes a count to the first state, activating the first state and producing an output on the line coupled to switch "1".

Sweep and Hold circuit 80 continues to cause the ramp voltage on line 82 to rise, generating IF pulses which actuate Schmitt trigger 92 each time the receiver tunes one of the simulated station frequencies. Because the mixer stage 24 of the receiver forms a part of the tuning loop, the station representations are counted without ambiguity. Each time Ring Counter 65 receives a tenth set pulse, the termination of the "9" output signal sets the first stage in the tens ring counter 67.

When the counters 65 and 67 reach the count initially selected by an operator on switches 15 and 17, a pair of negative going pulses are passed to lines 55 and 57, causing the Number Recognition circuit 70 to energize relay coil 72. As switch contacts 43 open, the oscillator 40 is disabled, terminating the generation of simulated stations. At the same time, the switch contacts 74 close, causing the Sweep and Hold circuit 80 to maintain the instant ramp voltage then on line 82, and superimpose thereon an AFC voltage from an AFC output line 96. Thus, the receiver will lock to any adjacent external station from antenna 22 which has a frequency very close to the station frequency selected by the switches 15 and 17. The receiver 11 now operates in a conventional manner, receiving the selected station until the operator selects a new station on switches 15 and 17 and again actuates the reset switch 60.

Many modifications can be made to the frequency selector 10 without departing from the present invention. Additional stations at the upper end of the AM band can be received by providing an additional hundreds counter stage and associated switch. While 10 kHz harmonic pulses are preferred for the simulated station signals because AM broadcast stations are allocated frequencies spaced apart by 10 kHz intervals, other frequency intervals can be utilized. When the receiver 11 tunes other frequencies than standard AM broadcast, the minimum spacing allocated to different stations will change, and the primary frequency of oscillator 40 should be changed accordingly.

Figures 2, 3:
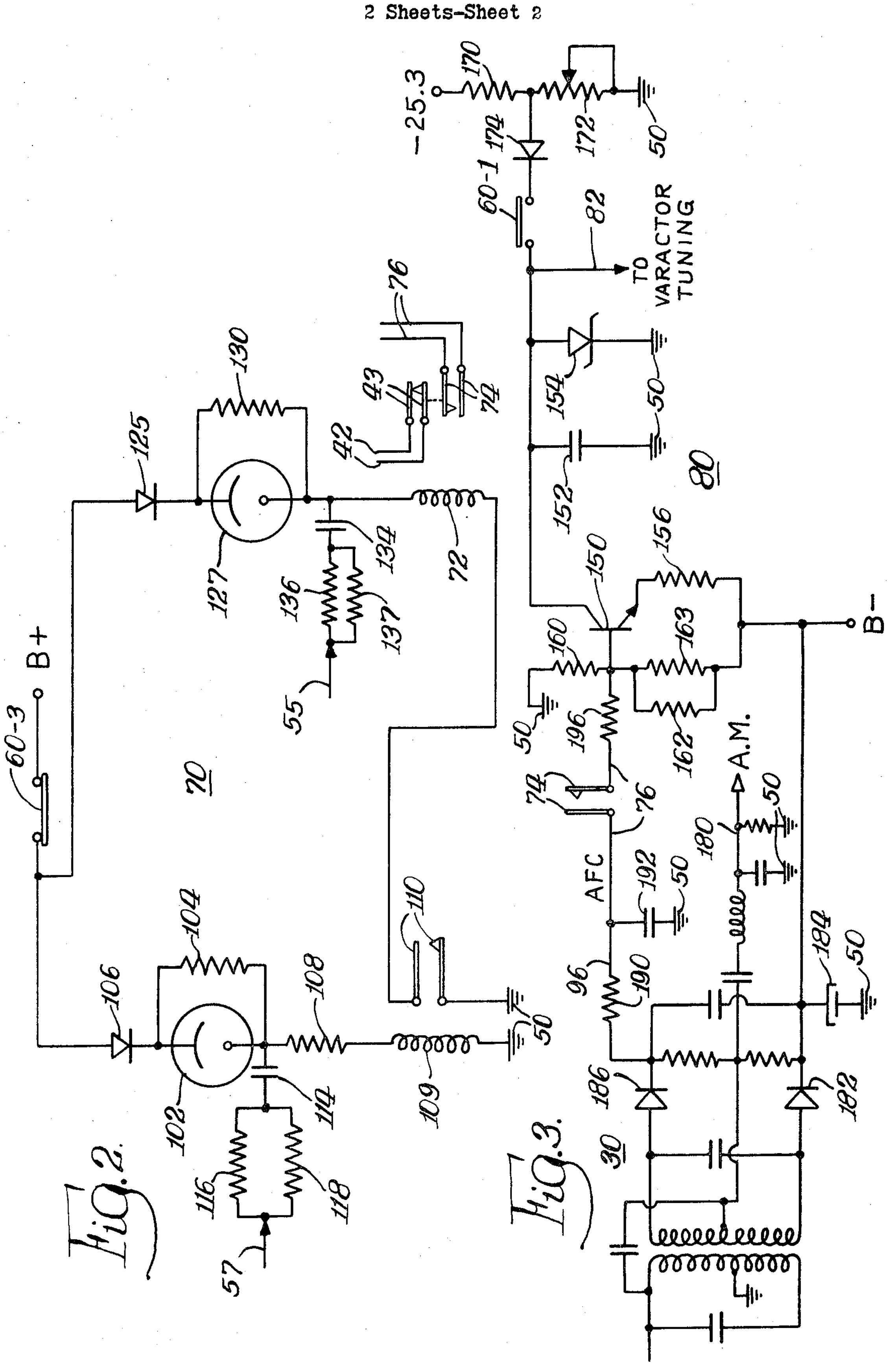
FIG. 2 is a schematic diagram of the Number Recognition circuit illustrated in block form in FIG. 1.
FIG. 3 is a schematic diagram of a portion of the Discriminator and AFC stage, and the complete Sweep and Hold circuit illustrated in block form in FIG. 1.

In FIG. 2, the Number Recognition circuit 70 is illustrated in detail. A tens recognition section consists of a neon lamp 102 having a 33 kilohm resistor 104 shunted across its electrodes. Positive DC voltage on B+ is coupled through the normally closed switch section 60-3 to a diode 106 connected in series with one electrode of the neon lamp 102. The other electrode is coupled through a 22 kilohm resistor 108 and a relay coil 109 to ground 50. When energized, relay coil 109 closes a pair of normally open switch contacts 110. The junction between resistors 104 and 108 is also coupled through a 0.1 microfarad capacitor 114 and a pair of paralleled resistors 116 and 118, as 390 kilohms and 470 kilohms, respectively, to common line 57 associated with the tens Ring Counter.

A units number recognition section is generally similar to the tens number recognition section. Switch contact 60-3 is also coupled through a diode 125 to one electrode of a second neon lamp 127, the opposite electrode of which is coupled directly to relay coil 72. The neon lamp 127 is shunted by a 68 kilohm resistor 130. The junction between resistor 130 and relay coil 72 is coupled through a 0.1 microfarad capacitor 134 and a pair of paralleled resistors 136 and 137, as 1 megohm and 270 kilohms, respectively to line 55.

The DC value of the B+ voltage is selected to be below the firing or ionization potential of the neon lamps 102 and 127, but above their extinction level. When no pulse has been received on either lines 55 or 57, both neon lamps are deenergized, opening the circuits to the pair of relay coils 72 and 109.

Each time the units Ring Counter 65, FIG. 1, counts to the number of the actuated switch 15, a pulse of negative going direction is coupled to common line 55. However, neon lamp 127 is not ignited at this time because the path to ground 50 is open circuited by the open switch contacts 110.

When the tens Ring Counter 67, FIG. 1, counts to the decade value corresponding to an actuated switch 17, a negative going pulse is coupled to line 57. Returning to FIG. 2, the negative pulse causes the voltage across neon lamp 102 to exceed its ignition value, thereby igniting the neon lamp and causing its internal impedance to switch to a low value. This produces a large current flow through relay coil 109 sufficient to close the switch contacts 110, grounding relay coil 72. The neon lamp 102 remains energized at this time, since the value of B+ is above the extinction value.

When the units Ring Counter again counts to the units value corresponding to an actuated switch, another negative going pulse is coupled to line 55. Since relay coil 72 is grounded, clamping the DC voltage at the junction of resistor 130 and capacitor 134 to ground potential, the negative going pulse is sufficient to cause the break-over potential of the neon lamp 127 to be exceeded. The resulting substantially increased current flow through relay coil 72 is now sufficient to open the normally closed pair of contacts 43 and close the normally open pair of contacts 74. Relay 72 remains actuated until the reset switch 60-3 is again actuated, disconnecting B+ from the pair of neon lamps 102 and 127 and causing them to extinguish.

In FIG. 3, a portion of the Discriminator and AFC circuit 30, and the complete Sweep and Hold circuit 80, are illustrated in detail. Circuit 80 includes an amplifying device, such as an NPN transistor 150, having its collector electrode directly connected with varactor control line 82. The elector is shunted to ground 50 through a 65 microfarad capacitor 152 and a Zener diode 154 having a break-over potential slightly in excess of the maximum voltage which should be coupled to the varactor tuning line 82. The emitter electrode of transistor 150 is coupled through a 1 kilohm resistor 156 to a negative DC voltage source, or B−. To bias the transistor, a 20 megohm resistor 160 in series with a pair of paralleled resistors 162 and 163, 4.7 megohms and 470 kilohms, respectively, are coupled between ground 50 and B−. The junction between the resistors is directly coupled to the base electrode of the transistor.

To establish the initial start frequency for the local oscillator, an adjustable voltage source is provided, consisting of an 18 kilohm resistor 170 and a variable resistor 172 having a maximum resistance of 10 kilohms, connected in series between ground 50 and −25.3 volts DC. The junction of the voltage divider resistors is coupled through a diode 174 to the normally open switch section 60-1, the opposite side of which connects to line 82.

In operation, the reset switch section 60-1 is closed when a new tuning cycle is being initiated. The closed switch clamps the collector electrode of transistor 150, and the capacitor 152, to a low negative voltage selected by the variable resistor 172. The low voltage, such as −2 volts DC, is coupled via line 82 to the varactor tuning circuits, producing a high varactor capacity which corresponds to a low frequency. The variable resistor 172 is adjusted so that the voltage produces a tuning frequency that is one RF interval, herein 10 kilohertz, below the first count frequency, herein 540 kilohertz, which corresponds to the low end of the band. Any charge across capacitor 152 which produces a voltage greater than the clamping voltage is also discharged at this time.

As the reset switch 60-1 is released, the transistor 150 begins to sweep or drift towards saturation, due to forward biasing of the base-emitter junction. The rate at which the sweep amplifier drifts towards saturation is determined by the circuit parameters including the resistance values and the value of capacitor 152. The resulting increasing negative voltage across capacitor 152 causes the varactor tuning circuit to decrease in capacity, thereby steadily increasing the tuning frequency.

When the selected tuning frequency is reached, switch contacts 74 close, converting the transistor 150 from a ramp voltage generator to a hold circuit combined with an amplifier, as will appear. The voltage across capacitor 152 now follows the AFC voltage. Zener diode 154 may have a break-over voltage of 11.5 volts, for example, to prevent destruction of the varactor tuning circuit at the high end of the AM band should the sweep operation continue due to some failure in the circuit.

Generally, any discriminator 30 which generates a floating AFC voltage can be used for connection to circuit 80. By way of example, a discriminator of the Foster-Seeley type is illustrated. Because such a discriminator is AM sensitive, an AM output is also produced on a line 180. The illustrated circuit is conventional except that a cathode 182 of one detecting diode is coupled to ground 50 through a capacitor 184, rather than being directly coupled to ground. At a cathode 186 of the opposite detecting diode, a 56 kilohm resistor 190 couples AFC voltage to line 96 which is shunted to ground 50 through a 0.01 microfarad capacitor 192. The resulting Foster-Seeley discriminator floats above ground. The AFC line 96 is connected through switch contacts 74 and a 100 kilohm resistor 196 to the base of transistor 150.

When switch contacts 74 close, the AM discriminator circuit 30 is placed in the biasing circuit of the sweep amplifier. The amplifier bias is now changed so that it no longer drifts towards saturation, but instead acts like a DC amplifier for causing the instant voltage across capacitor 152 to follow the AFC voltage. Because the AM discriminator is floating, the discriminator is essentially maintained at the bias potential of the transistor 150. The sweep generator which is converted to an AFC amplifier upon closing of switch contacts 74 also has utility in automatic tuning systems of conventional design.

I claim:

1. In a receiver having receiver local oscillator means for generating different frequency oscillations to tune the receiver to different tunable frequencies, receiver detector means responsive to received signals and said oscillations to produce detected signals, and utilization means coupled to said receiver detector means for utilizing in said receiver said detected signals, an automatic frequency selector, comprising:

generator means for generating a plurality of reference signals coupled to said receiver detector means and each having a different frequency representing said different tunable frequencies;

sweep means for sweeping the oscillations of said receiver local oscillator means through a band of frequencies to cause said receiver detector means to produce an output signal for each reference signal tuned by the receiver local oscillator means;

counter means coupled to said receiver detector means for counting said output signals; and recognition means responsive to a predetermined count in said counter means for disabling said sweep means and maintaining a selected frequency.

2. The automatic frequency selector of claim 1 wherein said recognition means includes switch means actuable to select different predetermined counts, and circuit means for disabling said sweep means when the count from said counter means corresponds to the predetermined count set on said switch means.

3. The automatic frequency selector of claim 2 wherein said switch means includes a plurality of groups of individual switch elements in which at least one switch element in each group is actuated to select a predetermined count, and said circuit means includes a plurality of gate means each associated with a different one of said groups of switches, each gate means being actuated when the count in said counter means corresponds to the individual actuated switch element, and combining means responsive to actuation of all of said gate means for disabling said sweep means.

4. The automatic frequency selector of claim 2 wherein said switch means comprise a plurality of switch elements, said counter means comprises a ring counter having a plurality of stages, and said circuit means connects each stage of said ring counter to a different one of said switch elements.

5. The automatic frequency selector of claim 1 wherein said sweep means includes ramp means for generating a ramp signal for sweeping said local oscillator means until disabled by said recognition means, and hold means responsive when said ramp means is disabled for holding the instant value of said ramp signal to maintain said receiver tuned to the selected frequency.

6. The automatic frequency selector of claim 5 wherein said receiver includes AFC means for generating an AFC signal to lock said receiver to received signals adjacent the selected tunable frequency, and said hold means includes bias means for causing the signal value maintained by said hold means to follow said AFC signal.

7. The automatic frequency selector of claim 6 wherein said hold means includes a first amplifying device, capacitor means connected to said amplifying device for generating thereacross said ramp signal, power supply means coupled to said amplifying device for causing said amplifying device to charge said capacitor means, and said bias means is responsive to said predetermined count for converting said amplifying device to an AFC amplifier.

8. The automatic frequency selector of claim 5 including an adjustable voltage source, and reset means actuated when said automatic frequency selector is to begin operation for connecting said adjustable voltage source of said ramp means to establish the initial frequency tuned by said local oscillator means.

9. The automatic frequency selector of claim 8 wherein said reset means includes an additional reset section, and means connecting said additional reset section to said counter means to clear the count recorded therein.

10. The automatic frequency selector of claim 8 wherein said reset means includes an additional reset section, and means responsive to said additional reset section for enabling said generator means when said automatic frequency selector is to begin tuning said receiver.

11. The automatic frequency selectOr of claim 10 wherein said recognition means includes means responsive to said predetermined count for disabling said generator means.

12. The automatic frequency selector of claim 1 wherein said generator means comprises oscillator means for generating a primary frequency signal and a plurality of harmonic frequency signals spaced apart by said primary frequency, said harmonic frequency signals forming said plurality of reference signals.

13. The automatic frequency selector of claim 12 wherein said generator means includes differentiator means coupled between said oscillator means and said detector means for differentiating said harmonic frequency signals to produce reference signals of short time duration.

14. The automatic frequency selector of claim 13 wherein said generator means includes clipping diode means coupled to said differentiator means for eliminating differentiated harmonic frequency signals of predetermined polarity.

15. The automatic frequency selector of claim 1 including level trigger means coupled between said detector means and said counter means, said level trigger means producing a trigger pulse which is counted by said counter means when the level of said output signal from said detector means exceeds a predetermined minimum amplitude.

16. The automatic frequency selector of claim 15 wherein said detector means includes mixer means for heterodyning said received signals with said oscillations to produce IF signals and IF amplifying means responsive to said IF signals for producing said output signals which are coupled to said level trigger means.

* * * * *